United States Patent
Okuno et al.

[11] Patent Number: 5,607,781
[45] Date of Patent: Mar. 4, 1997

[54] OXIDE FILM WITH PREFERRED CRYSTAL ORIENTATION, METHOD OF MANUFACTURING THE SAME, AND MAGNETO-OPTICAL RECORDING MEDIUM

[75] Inventors: Shiho Okuno, Kawasaki; Susumu Hashimoto, Tokyo; Koichiro Inomata, Yokohama, all of Japan

[73] Assignee: Kabushiki Kaisha Toshiba, Kawasaki, Japan

[21] Appl. No.: 329,514

[22] Filed: May 26, 1994

Related U.S. Application Data

[63] Continuation of Ser. No. 551,899, Jul. 12, 1990, abandoned.

[30] Foreign Application Priority Data

Jul. 27, 1989 [JP] Japan ................. 1-192513
Sep. 8, 1989 [JP] Japan ................. 1-231446
Apr. 27, 1990 [JP] Japan ................. 2-113201

[51] Int. Cl.⁶ .............. G11B 5/66; C23C 14/00; B05D 5/12

[52] U.S. Cl. .......... 428/694 ML; 428/694 SC; 428/694 GT; 428/694 TS; 428/694 T; 428/694 ST; 428/694 MM; 428/694 TM; 428/692; 428/702; 428/900; 204/192.1; 204/192.11; 204/192.14; 204/192.15; 204/192.2; 204/192.26; 427/128; 427/595; 427/599; 252/62.51 R; 252/62.56; 252/62.51 C; 369/13

[58] Field of Search .............. 428/694 SC, 694 GT, 428/692, 702, 900, 694 TS, 694 T, 694 ST, 694 MM, 694 TM; 204/192.1, 192.11, 192.14, 192.15, 192.2, 192.26; 427/128, 35; 252/62.51, 62.56; 369/13

[56] References Cited

U.S. PATENT DOCUMENTS

| | | | |
|---|---|---|---|
| 3,607,390 | 9/1971 | Comstock et al. | 117/8 |
| 4,586,092 | 4/1986 | Martens et al. | 360/59 |
| 4,839,226 | 6/1989 | Sawada et al. | 428/336 |
| 4,975,324 | 12/1990 | Torii et al. | 428/329 |

FOREIGN PATENT DOCUMENTS

| | | |
|---|---|---|
| 161088 | 11/1985 | European Pat. Off. . |
| 308869 | 3/1989 | European Pat. Off. . |
| 56-7230 | 1/1981 | Japan . |

OTHER PUBLICATIONS

Journal of the Japan Society of Powder and Powder Metallurgy vol. 35, No. 3, p. 197; H. Torii et al.; 1988 (English Abstract Only).

Journal of the Magnetic Society of Japan vol. 12, No. 2, p. 339; E. Fujii et al.; 1988 (English Abstract Only).

Journal of the Japan Society of Powder and Powder Metallurgy vol. 35, No. 3, p. 202; E. Fujii et al.; 1988 (English Abstract Only).

Primary Examiner—Leszek Kiliman
Attorney, Agent, or Firm—Oblon, Spivak, McClelland, Maier & Neustadt, P.C.

[57] ABSTRACT

An oxide film having, for example, a spinel structure is deposited on a substrate, and ions of an inert gas such as He, Ar, Ne, Kr, or Xe, oxygen gas ions, or metal ion of a film constituting element are radiated onto the film during deposition, thereby to obtain an oxide thin film in which a specific crystal direction is oriented.

10 Claims, 16 Drawing Sheets

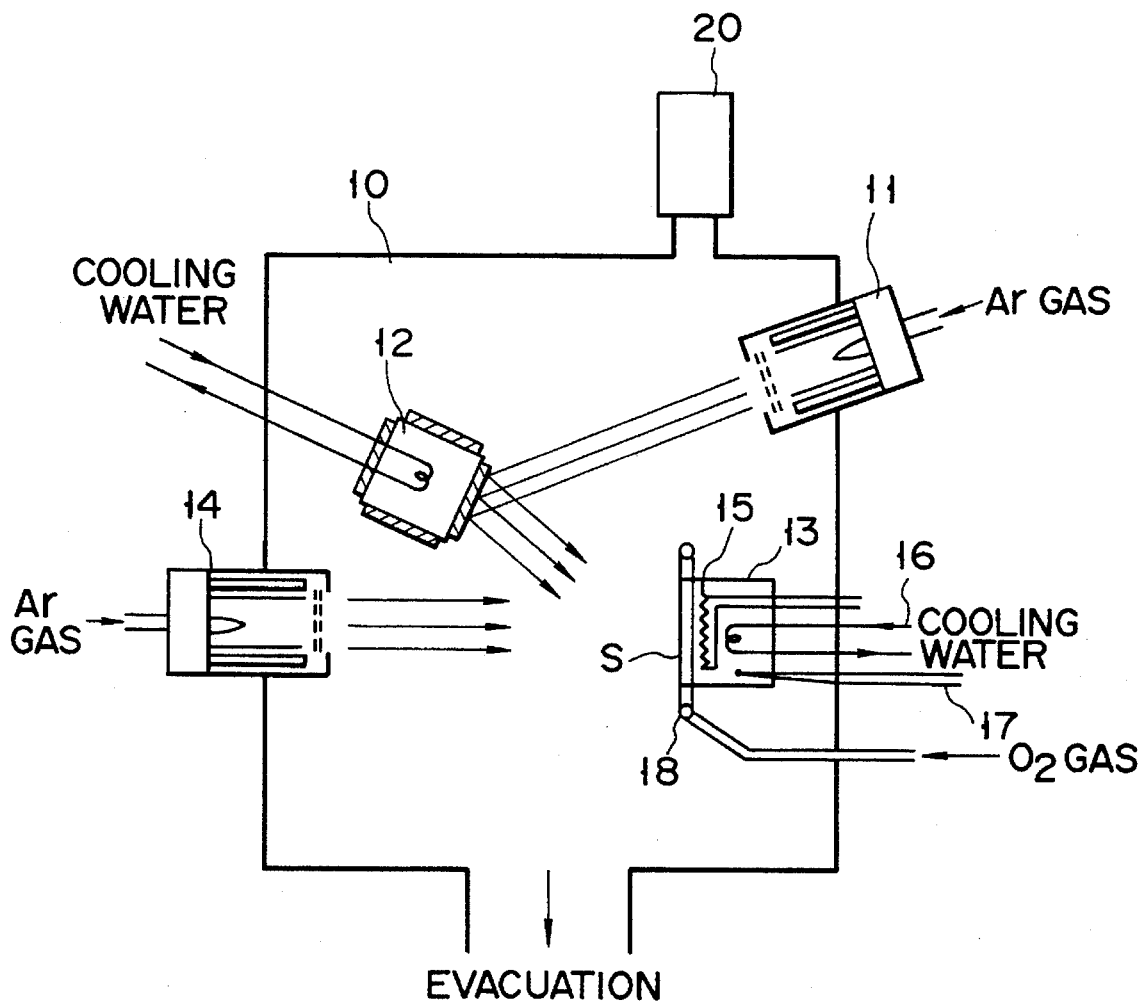
F I G. 1

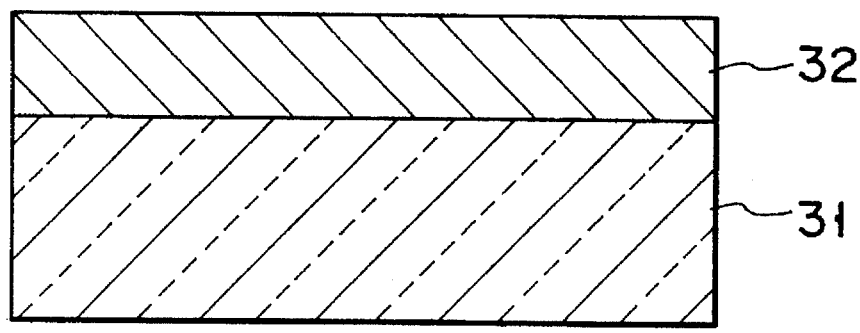
F I G. 2
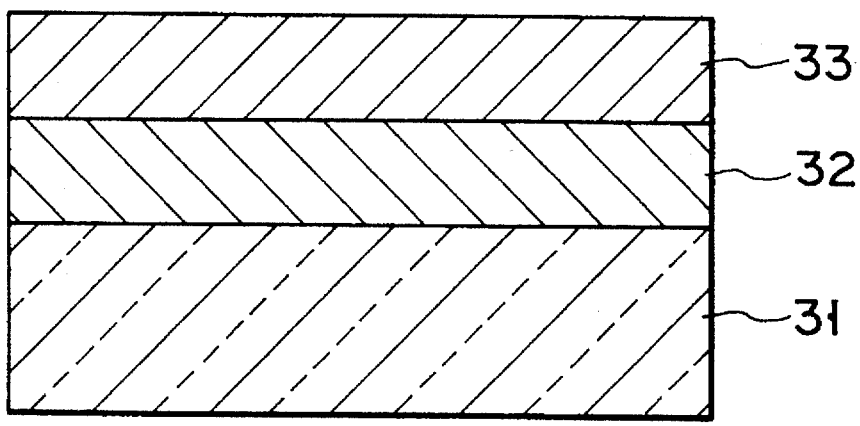
F I G. 3

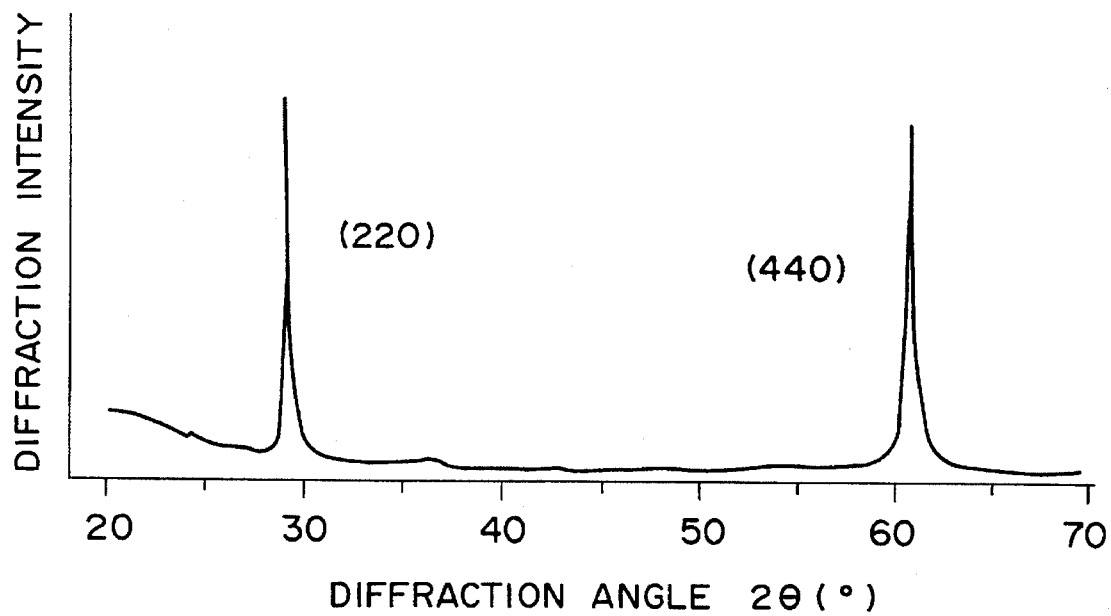
F I G. 4A
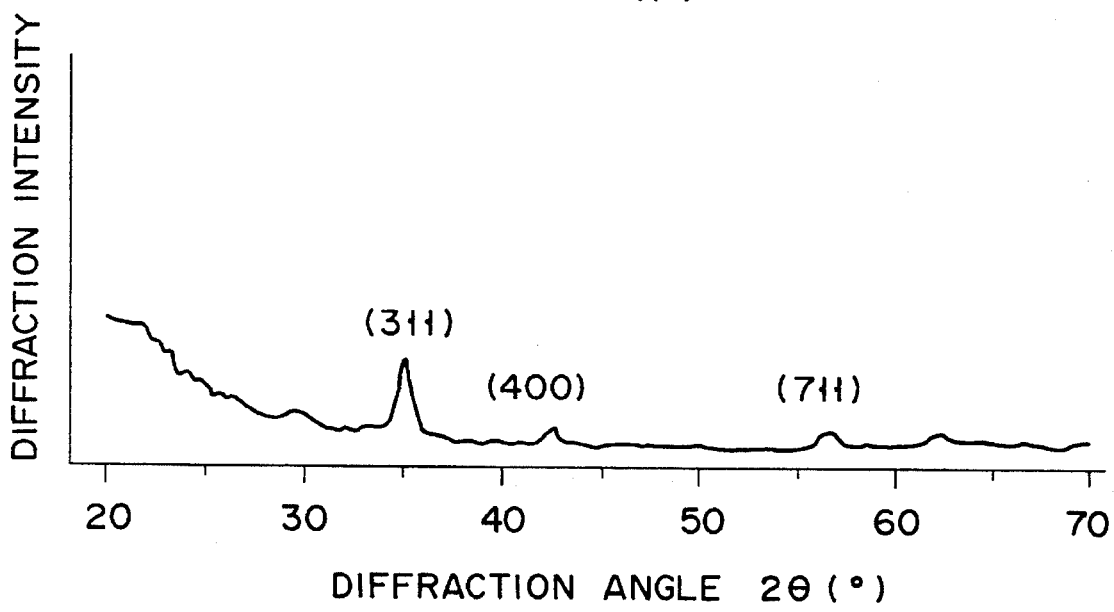
F I G. 4B

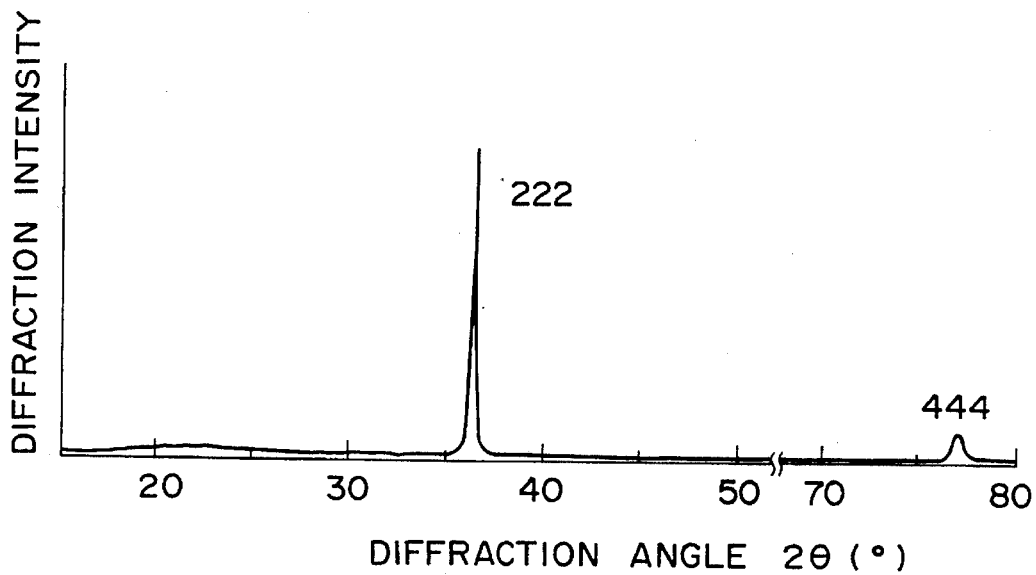
F I G. 10A
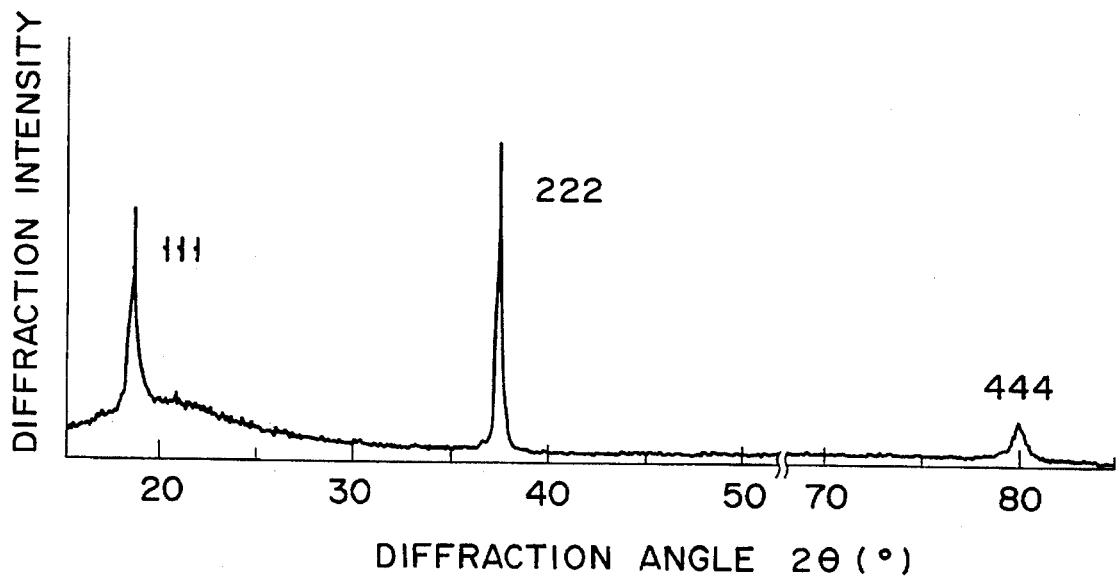
F I G. 10B

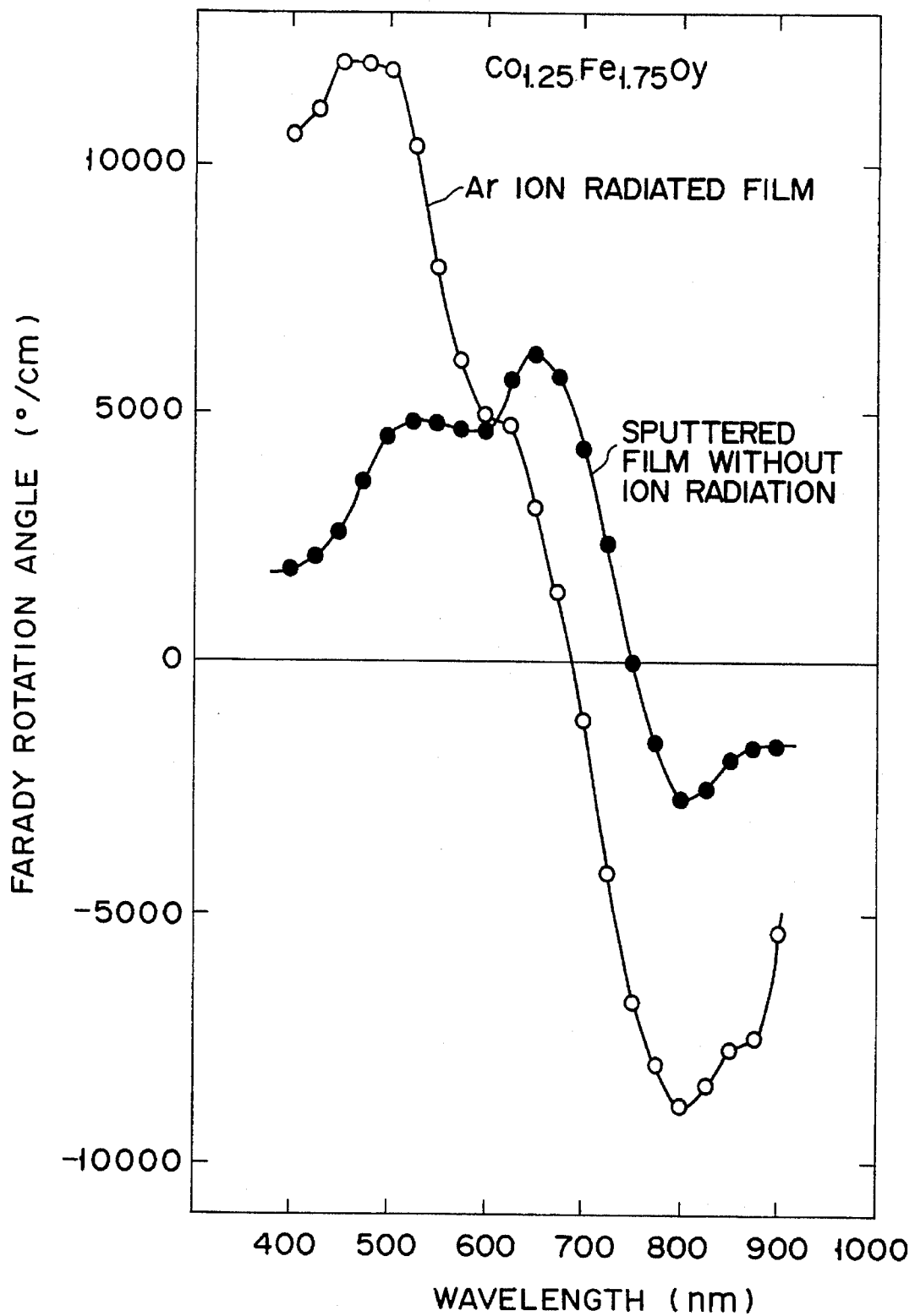
F I G. 13

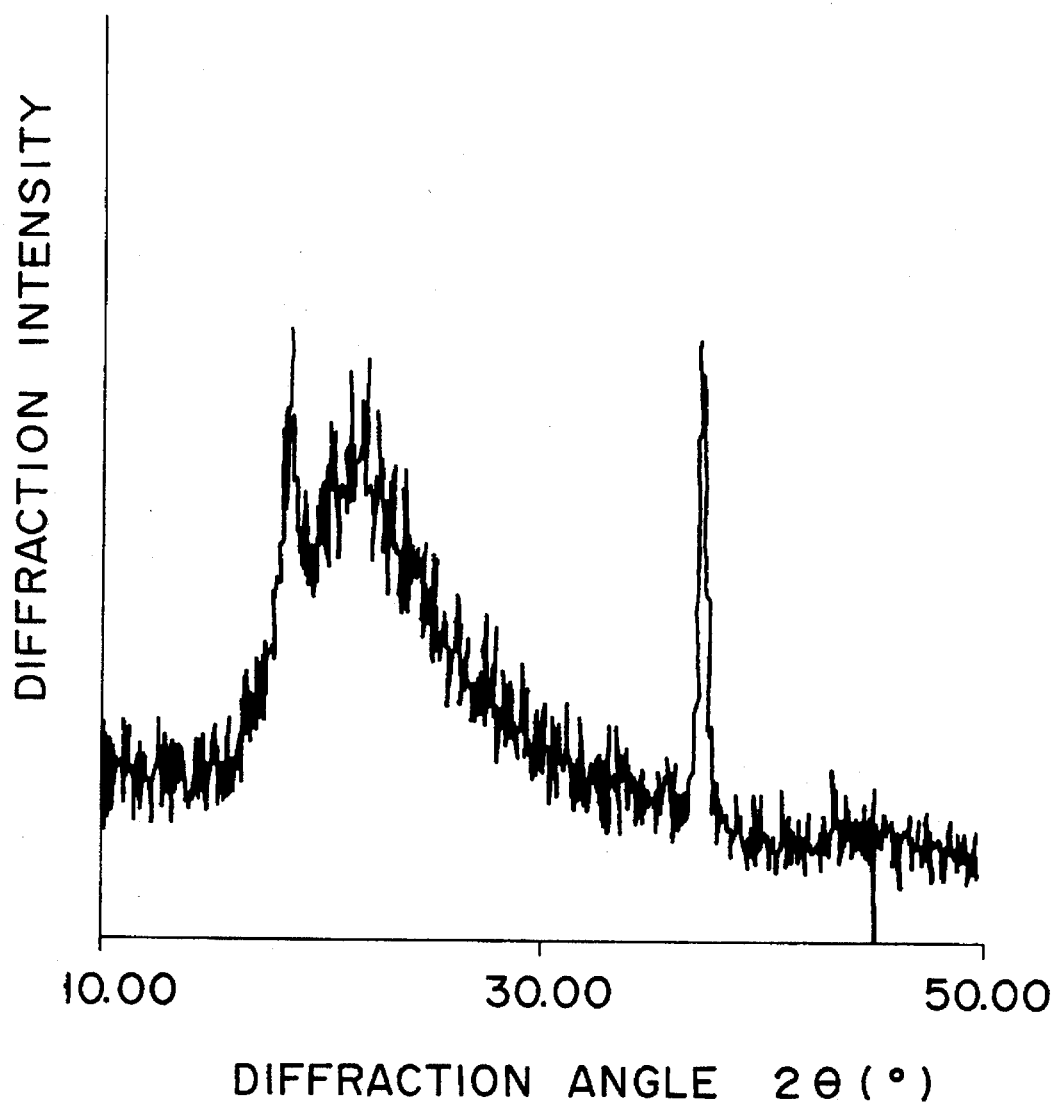
F I G. 14

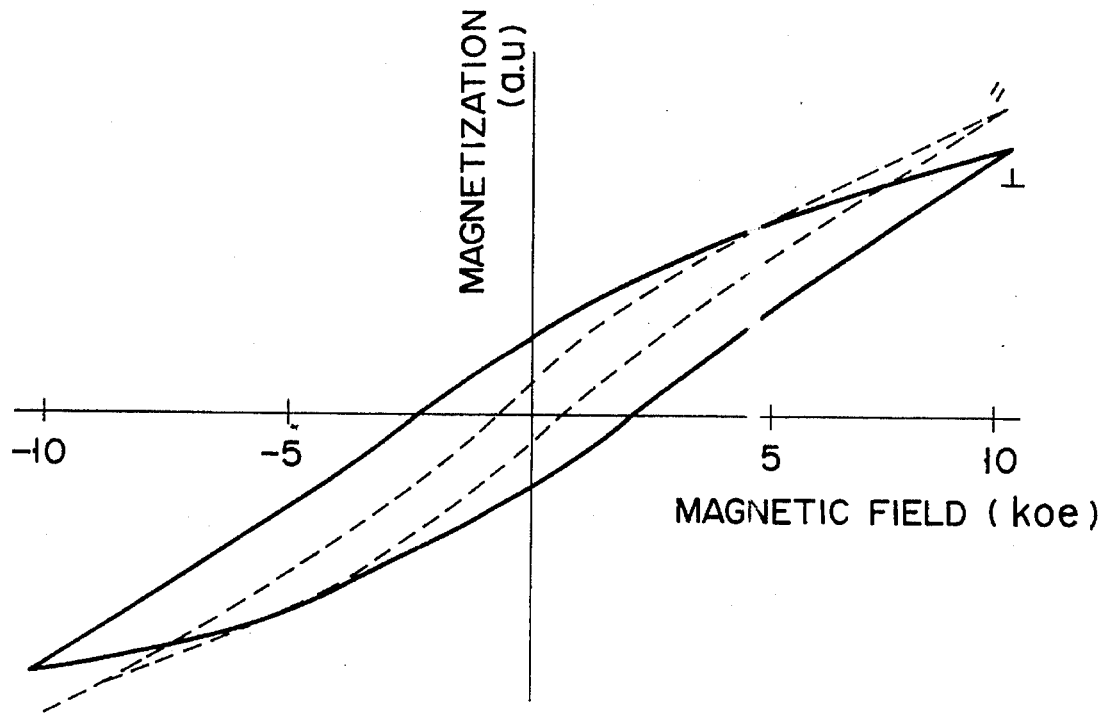
F I G. 17
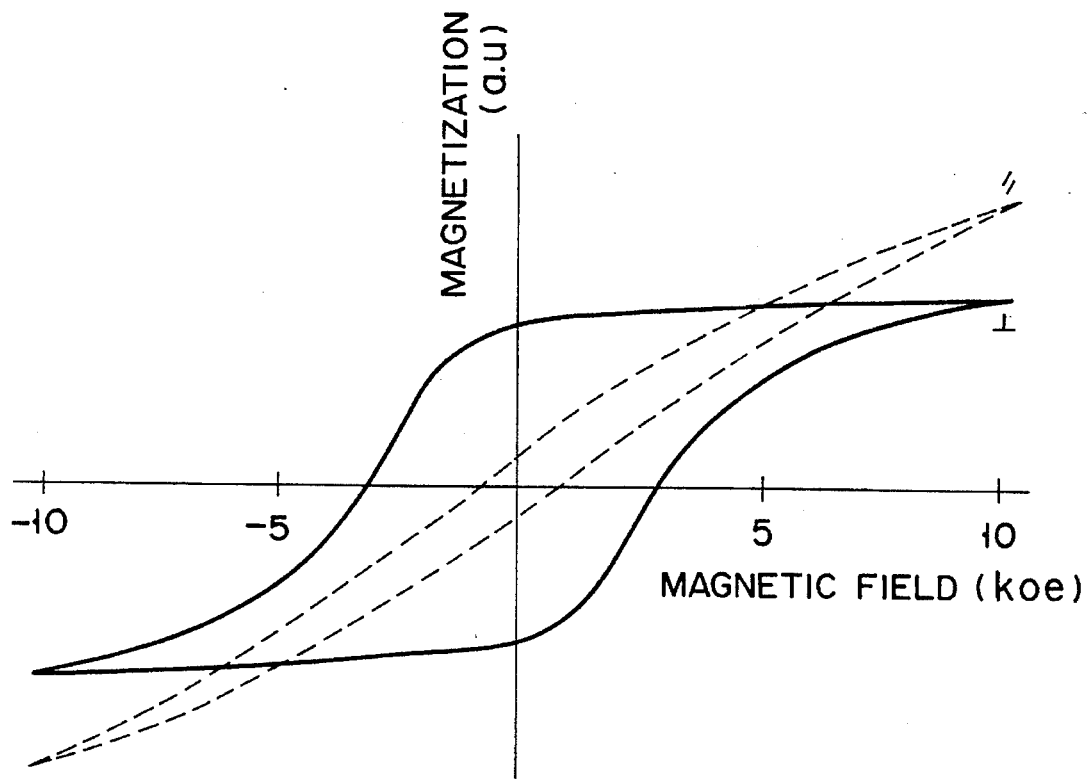
F I G. 18

OXIDE FILM WITH PREFERRED CRYSTAL ORIENTATION, METHOD OF MANUFACTURING THE SAME, AND MAGNETO-OPTICAL RECORDING MEDIUM

This application is a Continuation of application Ser. No. 07/551,899, filed on Jul. 12, 1990, now abandoned.

BACKGROUND OF THE INVENTION

1. Field of the Invention

The present invention relates to an oxide film—with preferred crystal orientation, to a method of manufacturing the same, and to a magneto-optical recording medium using an oxide film—with preferred crystal orientation having a specific composition.

2. Description of the Related Art

Various thin film formation methods such as the CVD method, the vapor deposition method, and the sputtering method are widely known. The type of oxide thin film normally formed on an amorphous substrate such as glass is an amorphous thin film or a polycrystalline thin film the crystal direction of which is irregular.

Obtaining a thin film crystal oriented in a specific direction is important from the point of view of improving material characteristics. As stated above, however, a crystal-oriented film cannot be obtained when an amorphous substrate is used. Therefore, in order to obtain an oxide thin film with preferred crystal orientation, it has hitherto been necessary to use instead a single-crystal substrate made of, for example, MgO or $\alpha$-$Al_2O_3$ (as described in, e.g., IEEE Trans. Mag. MAG-12 (1976) 773, J. Appl. Phys. 66 (1989) 3168).

In general, however, a single-crystal substrate is expensive, and is considerably limited as regards the type and size obtainable; thus, it has low applicability. Therefore, if an oxide thin film with preferred crystal orientation could be formed by using an amorphous substrate made of, for example, glass or resin, many practical advantages would be obtained, since the limits inherent in a single-crystal substrate would no longer apply.

SUMMARY OF THE INVENTION

The present invention has been developed in light of the above situation and has as its first object to provide a manufacturing method whereby an oxide thin film with preferred crystal orientation can be formed without the need to use a single-crystal substrate, the second object being to provide an industrially advantageous oxide film with preferred crystal orientation, and the third object being to provide a magneto-optical recording medium using the oxide thin film with preferred crystal orientation and having excellent recording characteristics.

According to an aspect of the present invention, there is provided a method of manufacturing an oxide film with preferred crystal orientation for obtaining an oxide thin film in which a specific crystal direction is oriented, and which comprises the steps of depositing an oxide on a substrate, and radiating ions onto the film during the deposition step.

According to another aspect of the present invention, there is provided a method of manufacturing an oxide film with preferred crystal orientation for obtaining a spinel type film in which a specific crystal direction is oriented, and which comprises the steps of depositing an oxide having a spinel composition on a substrate, radiating ions onto the film during the deposition step; and heating the thin film formed in these steps.

According to still another aspect of the present invention, there is provided an oxide film with preferred crystal orientation which is formed on an amorphous substrate and has a spinel crystal structure wherein a <111> direction or a <110> direction preferredly oriented.

According to yet another aspect of the present invention, there is provided an oxide film with preferred crystal orientation which has a composition represented by the formula $A_xB_{3-x}O_y$ (wherein A is at least one member selected from the group consisting of Mn, Co, Ni, Cu, Mg, Cr, Zn, Li, and Ti, B is Fe or Al, $0.5 \leq x \leq 2.0$, and $2.5 \leq y \leq 4$) and wherein, assuming that the crystal structure of the film is spinel, the ratio $I_{111}/I_{222}$ of the reflection peak intensity $I_{111}$ of a (111) crystal plane with respect to the reflection peak intensity $I_{222}$ of a (222) crystal plane is less than 0.2 when the X-ray diffraction peak is represented by an index.

According to a further aspect of the present invention, there is provided a magneto-optical recording medium comprising a substrate, and a recording layer formed on the substrate and having a spinel ferrite thin film wherein a <111> direction is preferredly oriented in a direction perpendicular to the major surface of the substrate.

According to the present invention, there is provided a method which allows formation of an oxide film with preferred crystal orientation on an amorphous substrate. Therefore, since the present invention can be advantageously used not only as a magneto-optical recording medium but also as a substrate on which to grow another film with preferred orientation or the like, its industrial applicability is very broad.

According to the present invention, there is provided an entirely new oxide with preferred crystal orientation film, such as a <110> or <111> oriented film, formed on an amorphous substrate.

In addition, a magneto-optical recording medium having perpendicular magnetic anisotropy and good recording characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing an apparatus for practicing the method of the present invention;

FIGS. 2 and 3 are sectional views showing a magneto-optical recording medium according to the present invention;

FIGS. 4A, 4B, 7, 9A, 9B, 10A, 10B, 11, 14, and 15 are graphs each showing an X-ray diffraction pattern of an oxide thin film sample;

FIGS. 6, 8, 16A, 16B, 17, and 18 are graphs each showing a magnetization curve of an oxide thin film sample;

FIG. 13 is a graph showing the wavelength dependency of the magneto-optical Faraday rotation angle of an oxide thin film sample.

DETAILED DESCRIPTION OF THE PREFERRED EMBODIMENTS

Figure 5:
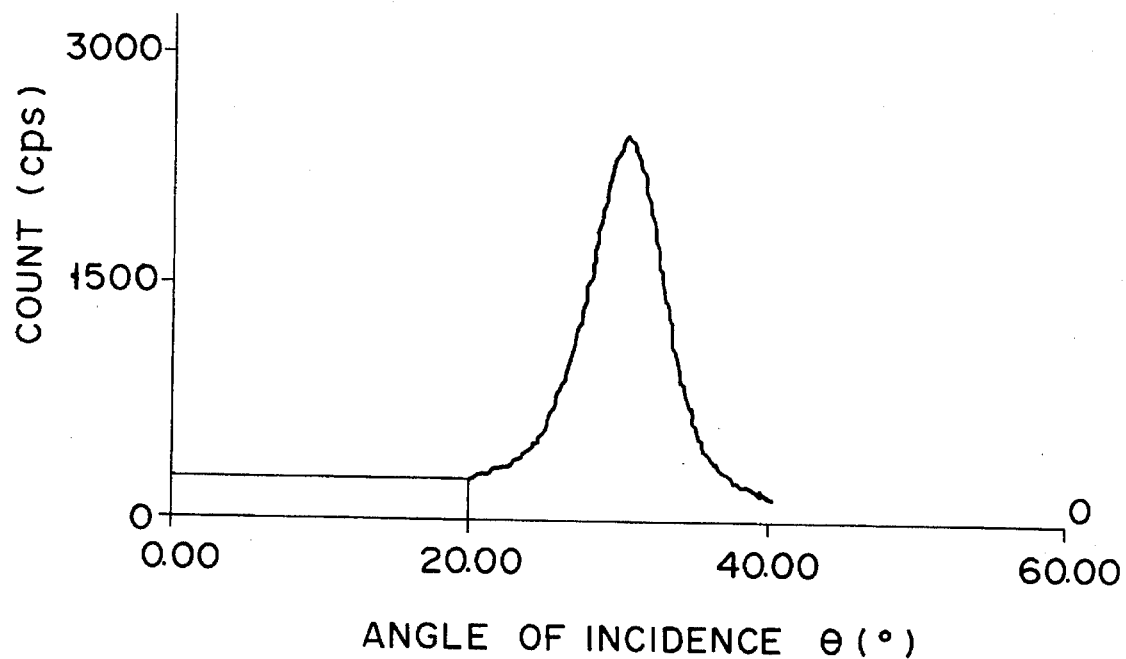
FIG. 5 is a graph showing a rocking curve of an oxide thin film sample manufactured by the method of the present invention.

The present inventors have conducted extensive studies in relation to oxide thin film formation and, as a result, have found that an oxide thin film having a desired crystal orientation can be obtained when an ion beam sputtering apparatus is used. That is, the present inventors have found that an oxide film with preferred crystal orientation can be obtained—regardless of the material constituting the substrate—by radiating ions onto the site of thin film formation during the film formation process. Accordingly, the present invention has been developed on the basis of this finding.

In short, the method of manufacturing an oxide film with preferred crystal orientation according to the present invention comprises the steps of depositing an oxide on a substrate and radiating ions onto the film during the deposition step, thereby to obtain an oxide thin film which a specific crystal direction is oriented.

The principle of the present invention will now be described in detail, with reference to FIG. 1.

FIG. 1 is a schematic view showing an ion beam sputtering (IBS) apparatus. This apparatus comprises a vacuum chamber 10 which includes a first ion gun 11, a target 12 irradiated with ions generated by the first ion gun 11, a support member 13 for supporting a substrate S on which atoms sputtered from the target are deposited, and a second ion gun 14 for radiating ions on the substrate S. The composition of the target 12 is adjusted in accordance with the composition of the thin film to be formed. A heater 15 for heating the substrate, a cooling water flow pipe 16 for cooling the substrate, and a thermocouple 17 are embedded in the support member 13. The substrate is heated/cooled in accordance with an output from the thermocouple 17, thereby to ensure proper control of the substrate temperature. A ring-like oxygen gas flow pipe 18 having a plurality of gas supply ports formed around its entire inner circumferential surface is provided around the substrate S. By supplying oxygen through the gas supply ports to the substrate S, oxygen deficiency in the thin film formed is prevented. The chamber 10 is evacuated by evacuating means (not shown), and the pressure therein is measured by a pressure gauge 20.

In the case of the apparatus having the above arrangement, after the chamber 10 is evacuated to a predetermined level of vacuum, the first ion gun 11 generates ions. These ions are accelerated and radiated onto the target 12, to sputter atoms constituting the target, the sputtered atoms being deposited on the substrate S. Subsequently, the second ion gun 14 radiates ions onto the substrate S during film formation. As a result, the atoms sputtered from the target 12 receive energy on the substrate S to form a thin film a specific crystal direction is oriented. The orientation direction changes in accordance with the film formation conditions and the target composition.

Note that the film formation method of the present invention is not limited to ion beam sputtering but that other known methods—for example, any of the various types of PVD methods such as vacuum vapor deposition or the CVD method—can be used to radiate ions during film formation. Simply stated, any film formation method can be used as long as ions can be radiated onto a thin film during thin film formation.

Examples of the type of ions which can be radiated onto the thin film are ions of an inert gas such as He, Ar, Ne, Kr, or Xe, oxygen gas ions, and metal ions of a film-constituting element. The acceleration voltage of radiated ions is preferably from 20 V to 2 kV, and more preferably from 20 V to 500 V. If the voltage is less than 20 V, the radiation effect will be unsatisfactory, whereas if the voltage exceeds 2 kV, the radiation will be too intense to permit good film quality to be obtained. It should also be noted that an energy beam capable of producing the same effect as above can be used in place of an ion beam.

The above method can be used to form an oxide film with preferred crystal orientation on a substrate, regardless of the material forming the substrate. In conventional methods, an oxide thin film with preferred crystal orientation can be formed only on a single-crystal substrate. According to the method of the present invention, an oxide film with preferred crystal orientation can be formed on an amorphous substrate such as glass, thereby eliminating the drawbacks of cost and limitation in size of inherent to the single-crystal substrate which can be obtained by conventional methods. Thus, the method of the present invention has significant industrial advantages. Further, the above manufacturing method has the additional merit in that a film having perpendicular magnetic anisotropy can be formed in an as-deposited state, without the need for heating.

A crystal oriented film formed thus can be used as a substrate for forming another thin film with preferred crystal orientation; in other words, by using a film with preferable crystal orientation formed on a glass substrate or the like by the method of the present invention as a substrate, the same effect as that obtained by using a single-crystal substrate can be obtained. Therefore, an oriented film can be formed on an oriented film formed by way of the method of the present invention even when a material is used from which, in the case of conventional methods, an oriented film could not be formed without using a single-crystal substrate. Therefore, film formation on a film with preferred crystal orientation obtained according to the present invention need not be performed by the method of the present invention, but instead can be formed without ion radiation.

In addition, by using the method of the present invention, a wide range of options as regards the material and oriented crystal direction, and the size of a substrate can be easily increased.

Examples of an oxide formed by the method of the present invention are those having spinel, garnet, perovskite, wurtzite, and NaCl type crystal structures.

In order to manufacture an oxide film with preferred crystal orientation having a spinel crystal structure ($AB_2O_4$; each of A and B represents a transition metal), the film is preferably heat-treated after being formed (with ions being radiated during film formation) as per the above-described method. As a result, a spinel crystal-oriented film having a desired crystal orientation can be obtained. The heat-treatment temperature is preferably 500° C. or higher. If the heating temperature is less than 500° C., a crystal structure slightly different from the spinel structure may be obtained, or a spinel crystal structure having low crystallinity or oxygen deficiency may be formed, thereby degrading the characteristics desired thereof. Although the heat treatment can be and is most easily performed in air, it should preferably be performed in an oxygen atmosphere, since this enables the amount of oxygen in the thin film to be controlled more precisely. It is not desirable that the heat treatment performed in an atmosphere in which the oxygen partial pressure is extremely low, as in a vacuum, because the oxygen in the thin film will be easily removed.

The above method can be used to form a spinel type oxide film with preferred crystal orientation on an amorphous substrate, and impart such a desirable characteristic as a high perpendicular magnetic anisotropy capability to the spinel crystal film obtained.

Examples of a spinel oxide are Co-ferrite, Ni-ferrite, Mn-ferrite, Zn-ferrite, and magnetite. Of these oxides, Co-ferrite ($CoFe_2O_4$) has a particularly large magneto-optical effect and therefore can be applied to a magneto-optical recording medium and the like to obtain an oxide crystal oriented film which has large industrial value.

The above method can be used to form an oxide film with preferred crystal oriented which has a spinel crystal structure and wherein a <111> or <110> direction is preferredly oriented on an amorphous substrate. Such a spinel crystal oriented film, formed on an amorphous substrate, is an entirely new type of film which cannot be obtained by conventional methods. This type of film can be obtained simply by proper control of the manufacture conditions, and does not depend on heat-treatment being performed after film formation. Note that the type of spinel oxide used to obtain such an oriented film is not limited to Co-ferrite, Ni-ferrite, Mn-ferrite, Zn-ferrite, magnetite, and the like, listed above, can also be used. The oxide crystal-oriented film which the <111> or <110> direction is preferredly oriented is expected to be used in a broad range of applications. In particular, an oriented film wherein the <111> direction is oriented perpendicular to the film surface can be used as a magneto-optical recording medium, as will be described later.

The above method according to the present invention can additionally be used to form an oxide thin film having a metastable phase.

When a thin film is formed by means of conventional thin film formation methods, a film is prepared in a non-equilibrium state, with the result that metastable phases such as c-BN and c-MoN, which do not appear in an equilibrium state, can be synthesized. These metastable phases are expected to exhibit superior characteristics to those of conventional stable phases. However, only a few effective metastable phases are conventionally found.

In the present invention, an entirely new metastable phase oxide film with preferred crystal orientation in which a specific crystal direction is oriented can be formed through defining of the film formation conditions in the above method according to the present invention. Specifically, according to the present invention, there is provided a metastable phase oxide film with preferred crystal orientation which has a formula $A_xB_{3-x}O_y$ (wherein A represents at least one member selected from the group consisting of Mn, Co, Ni, Cu, Mg, Cr, Zn, Li, and Ti, B represents Fe or Al, $0.5 \leq x \leq 2.0$, and $2.5 \leq y \leq 4$) having a spinel structure in an equilibrium state and in which, assuming that its crystal structure is a spinel structure, a ratio $I_{111}/I_{222}$ of reflection peak intensity $I_{111}$ of a (111) crystal plane with respect to reflection peak intensity $I_{222}$ of a (222) crystal plane is smaller than 0.2 when its X-ray diffraction peak is represented by an index. In other words, a new phase having a very small (111) peak can be obtained. This metastable phase is stable in air at up to 400° C., but changes into a spinel structure as an equilibrium phase at 500° C. or higher.

Similar to the above oxide crystal film with preferred crystal orientation, various film formation methods can be used to create the above metastable phase crystal-oriented film, with the type of ion to be radiated onto a thin film and the preferred range of the manufacturing conditions being similar to those described above. The metastable phase film with preferred crystal orientation can be used as a substrate for forming another film with preferred crystal orientation similar to the above oxide film with preferred crystal orientation. More precisely, an oriented film formed on a glass substrate or the like by the method of the present invention can itself be used as a substrate, and obtain the same effect as that obtained by using a single-crystal substrate, and a material from which an oriented film cannot be formed without using a single-crystal substrate in the case of conventional methods can be formed as an oriented film on the substrate.

A magneto-optical recording medium using the oxide film with preferred crystal orientation according to the present invention will now be described.

A magneto-optical recording medium is used in, for example, magneto-optical recording and thermal transfer recording and performs recording/reproduction of information by using laser or the like.

In general, a magnetic thin film having an easy axis of magnetization perpendicular to a film plane and a Curie temperature higher than room temperature can be used as a high-density perpendicular magnetic recording medium or a high-density magneto-optical recording medium for recording/reproducing information of several μm or less by radiating a light beam such as laser beam. Examples of such a recording medium are a polycrystalline thin film consisting of, for example, Co-Cr, Ba-ferrite, or MnBi, a compound thin film consisting of, for example, GdIG (gadolinium iron garnet) and Co ferrite, and a rare earth-iron group amorphous alloy film consisting of, for example, Tb-Fe, Gd-Co, Tb-Co, or Tb-Fe-Co.

A write operation is performed on a polycrystalline metal thin film consisting of, for example, MnBi by utilizing a Curie temperature (Tc). However, since Tc is as high as 360° C., the write operation requires a high energy. In addition, since this type of thin film is made of polycrystals and therefore is required to have a stoichiometric composition, it is difficult to manufacture.

Film formation of GdIG is performed on a GGG (gadolinium gallium garnet) single-crystal substrate. As a result, magnetic characteristics are easily influenced by the conditions of the substrate, and it is difficult to manufacture a substrate having a large area.

On the other hand, a rare earth-iron group amorphous alloy thin film (RE-TM film) consisting of, for example, Gd-Co or Tb-Fe, however, can be used to form a magnetic thin film of arbitrary size, its composition can be easily controlled, and it has a high reproduction S/N ratio because it has no crystal grain boundary. Therefore, the RE-TM has been extensively studied as a magneto-optical recording medium. In general, however, the RE-TM has an unsatisfactory Faraday effect and Kerr effect, an insufficient C/N ratio, and a low oxidation resistance.

Co-ferrite has a satisfactory magneto-optical effect and a high oxidation resistance, since it is an oxide, and therefore is expected as an effective material. However, it is difficult to form a Co-ferrite film with perpendicular magnetic anisotropy. In addition, although a <100> oriented film has a perpendicular magnetic anisotropy, rectangularity of hysteresis of the obtained Co-ferrite perpendicular anisotropy film is unsatisfactory.

A magneto-optical recording medium according to the present invention uses a spinel ferrite thin film which is formed by the method according to the present invention and in which a specific crystal orientation direction is oriented as a recording layer. Specifically, the magneto-optical recording medium according to the present invention comprises a substrate and a recording layer formed on the substrate and having a spinel ferrite thin film in which a <111> direction is preferredly oriented in a direction perpendicular to the major surface of the substrate.

This magneto-optical recording medium will now be described in detail. As shown in FIG. 2, this medium comprises a substrate 31 and a recording layer 32 made of a spinel ferrite film formed thereon.

Spinel ferrite constituting the recording layer 32 is represented by a formula $MFe_2O_4$ (wherein M represents a divalent ion such as Zn, Mn, Fe, Co, Ni, Cu, Mg, or Li). Co-ferrite $Co_xFe_{3-x}O_{4-\delta}$ (for $0<\delta<1$) using Co as M has a strong magneto-optical effect (a Kerr effect and a Faraday effect) and is therefore preferred as a magneto-optical recording medium. In particular, a <111> oriented film can be easily obtained in a Co rich composition region, and M preferably satisfies $0.5 \leq x \leq 1.8$, and more preferably, $1.0 < x \leq 1.5$. If x is less than 0.5, a satisfactory magneto-optical effect cannot be obtained. If, on the other hand, x exceeds 1.8, the Curie point becomes too low for practical use. Note that the oxygen amount is represented by $4-\delta$, because the oxygen amount in a thin film is generally insufficient. A portion of Fe can be substituted by at least one (represented by T) of Cr, Al, Mn, and Rh. Assuming that Co ferrite is represented by $Co_xFe_{3-x-y}T_yO_{4-\delta}$, x and y satisfy $0.5 \leq x \leq 1.8$, $0 < y \leq 1.5$, and $0.8 \leq 3-x-y \leq 2.5$. If y exceeds 1.5, the Curie point becomes too low for practical use.

Since an easy axis of magnetization of spinel ferrite is a <100> direction, it is conventionally believed that a <100> oriented film is desirable in order to obtain a film with perpendicular magnetic anisotropy. However, the present inventors, conducted various extensive studies and found that even a <111> oriented film can serve as a film with perpendicular anisotropy, and thereby attain the present invention. The <111> oriented film exhibits perpendicular magnetic anisotropy because a magnetoelastic energy produced by a combination of a compression stress introduced into the film and positive $\lambda_{111}$ (magnetostriction in the <111> direction) overcomes the magnetocrystalline anisotropy energy.

While various materials can be used to form the substrate 31, use of an amorphous substrate consisting of, for example, glass or a resin is practically suitable effective.

In the magneto-optical recording medium having the above arrangement, rectangularity of a magnetization curve of the recording layer 32 as a film with perpendicular magnetic anisotropy may not be satisfactory. When the rectangularity of the recording layer is not satisfactorily, as shown in FIG. 3, a metal film 33 having a higher thermal expansion coefficient than that of spinel ferrite constituting the recording layer 32 is preferably formed on the recording layer 32. This metal film 33 allows a compression stress to be introduced into the recording layer 32 of the spinel ferrite film oriented in the <111> direction, thereby improving the rectangularity of the magnetization curve of the film with perpendicular magnetic anisotropy.

Preferred materials for forming the metal film 33 are Al, Au, Mn, Ag, Ni, and Cu. Metal film 33 can also be used as a reflecting film. Specifically, when reproduction is performed by using the Kerr effect, the reproduced signal can be enhanced by the metal film so as to obtain a high C/N ratio. The thickness of the metal film 33 is preferably equal to or greater than that of the recording layer 32.

Various film formation methods can be used to form the metal film 33, through after the recording layer 32 made of a spinel ferrite film is formed by the method of the present invention, the metal film 33 should preferably be formed by use of the apparatus used to form the recording layer.

By using the above, ion-radiation does not need to be performed. After the metal film 33 is formed, a heat treatment is preferably performed, since by doing so the rectangularity of the magnetization curve will be further improved.

In the magneto-optical recording medium having the above arrangement, the recording layer 32 is magnetized upward or downward, and a laser beam is radiated onto the recording layer 32, correspondence to a recording signal. The portion irradiated by the laser beam is heated to close to Curie point, causing magnetization reversal therein by means of an external magnetic field, and enable information recording. To erase information, magnetization reversal is again caused, and reproduction of information is performed by use of a magneto-optical effect such as the Kerr effect.

EXAMPLES

The present invention will now be described in more detail, by way of the following examples:

Example-1

The ion beam sputtering apparatus shown in FIG. 1 was used to manufacture a $CoFe_2O_4$ thin film. A sintered body (diameter=3 inches), manufactured by use of a conventional ceramic technique, was used as a target, and quartz glass was used as the substrate.

Previously, a vacuum chamber was evacuated to a vacuum degree of $4 \times 10^{-7}$ Torr, and oxygen gas (purity= 99.99%) was supplied through an oxygen flow pipe until $0.5 \times 10^{-4}$ Torr was obtained in the chamber, thereby to form a reaction atmosphere around the substrate.

Ar gas (purity 99.99%) was supplied to a main gun (first ion gun 11) until an Ar partial pressure of $1.5 \times 10^{-4}$ Torr was obtained. The Ar was ionized, and an acceleration voltage of 1 kV was applied thereto, to radiate an Ar ion beam onto the target. Upon radiation, the beam current was 45 mA, and when the target was irradiated by the ion beam, particles were sputtered from the target and deposited on the surface of the substrate. Ar gas (purity 99.99%) was supplied to a subgun (second ion gun 14) until $0.7 \times 10^{-4}$ Torr was obtained, and an acceleration voltage of 200 V was applied to radiate onto the substrate an Ar ion beam having a beam current of 10 mA. The substrate was arranged in a position onto which the subgun radiates an Ar ion beam perpendicularly.

FIG. 4A shows an X-ray diffraction pattern—obtained by $CuK\alpha$ rays (this also applies to the following description)— of a $CoFe_2O_4$ film manufactured by the above manufacturing method. FIG. 4B shows an X-ray diffraction pattern of a $CoFe_2O_4$ film manufactured, for the sake of comparison, without performing ion-radiation by the subgun. As shown in FIG. 4A, the $CoFe_2O_4$ film manufactured by the above method shows only (220) and (440) diffraction peaks, i.e., the <110> direction is oriented perpendicular to the film surface. As shown in FIG. 4B, the film manufactured without the performing of ion-radiation by the subgun shows diffraction peaks from various planes, i.e., the <110> direction is not particularly preferredly oriented. This means that a Co-ferrite film in which a specific crystal direction is oriented can be formed on an amorphous substrate by radiating an ion beam onto the film during film formation.

FIG. 5 shows a diffraction curve obtained when the angle of diffraction (2θ) of a (220) plane was maintained constant, and the angle of incidence (θ) was changed in the <110> oriented Co-ferrite film manufactured by the above method. The full-width at half maximum of the curve indicates the degree of orientation of a specific diffraction plane. A better orientation degree can be obtained by a smaller full-width at half maximum. As is apparent from FIG. 5, the full-width at half maximum is as small as about 5.5°, i.e., a good orientation is obtained. Note that a diffraction curve obtained when the angle of diffraction (2θ) of a specific diffraction plane (corresponding to (220) in this example) is maintained constant and the angle of incidence (θ) is changed will hereinafter be referred to as a rocking curve.

Example-2

Spinel ferrite films having the compositions shown in Table 1 were formed on quartz glass substrates, following the same procedures as in Example 1. As in the case of the film formed in Example 1, any of the formed films was an oriented film in which a specific crystal direction was oriented. Orientation directions of the films are also shown in Table 1. Note that the full-width at half maximum of the rocking curve of all of the films shown in Table 1 was about the same as that of the film of Example 1.

TABLE 1

| Sample No. | Composition | Orientation |
| --- | --- | --- |
| 1-1 | $Co_{0.8}Fe_{2.2}O_4$ | <110> |
| 1-2 | $CoFe_2O_4$ | <110> |
| 1-3 | $Co_{1.5}Fe_{1.5}O_4$ | <111> |
| 1-4 | $Co_{1.8}Fe_{1.2}O_4$ | <111> |
| 1-5 | $Co_{0.8}Cr_{1.2}FeO_4$ | <110> |
| 1-6 | $NiFe_2O_4$ | <111> |
| 1-7 | $Cu_{0.17}Fe_{2.83}O_4$ | <110> |

Note that for comparison, films having the same compositions were formed without ion radiation being performed, and that the orientations of these films were checked. As a result, it was found that none of the films was oriented.

Example-3

Figure 6:
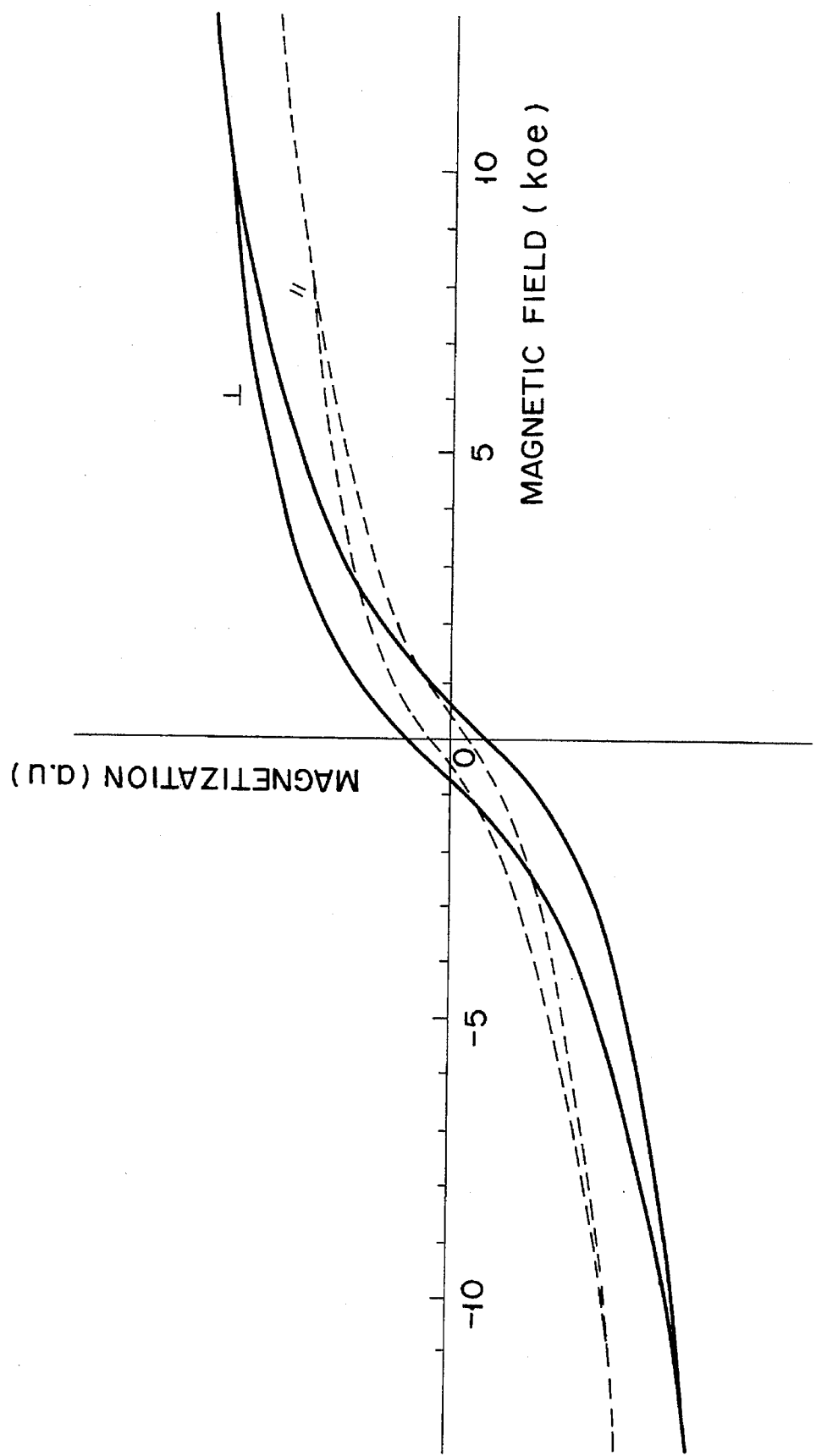

A magnetic field was applied in directions parallel and perpendicular to the $Co_{1.5}Fe_{1.5}O_4$ oriented film manufactured in Example 2, and hysteresis curves were measured. The result is shown in FIG. 6. As is apparent from FIG. 6, a higher residual magnetic flux density and a higher coercive force were obtained when the magnetic field was applied perpendicularly, i.e., a perpendicular magnetized film was obtained. In the case of this example, the Faraday rotation angle at a wavelength of 500 nm was found to be as large as $3\times10^4$ degrees/cm.

Example-4

Figure 7:
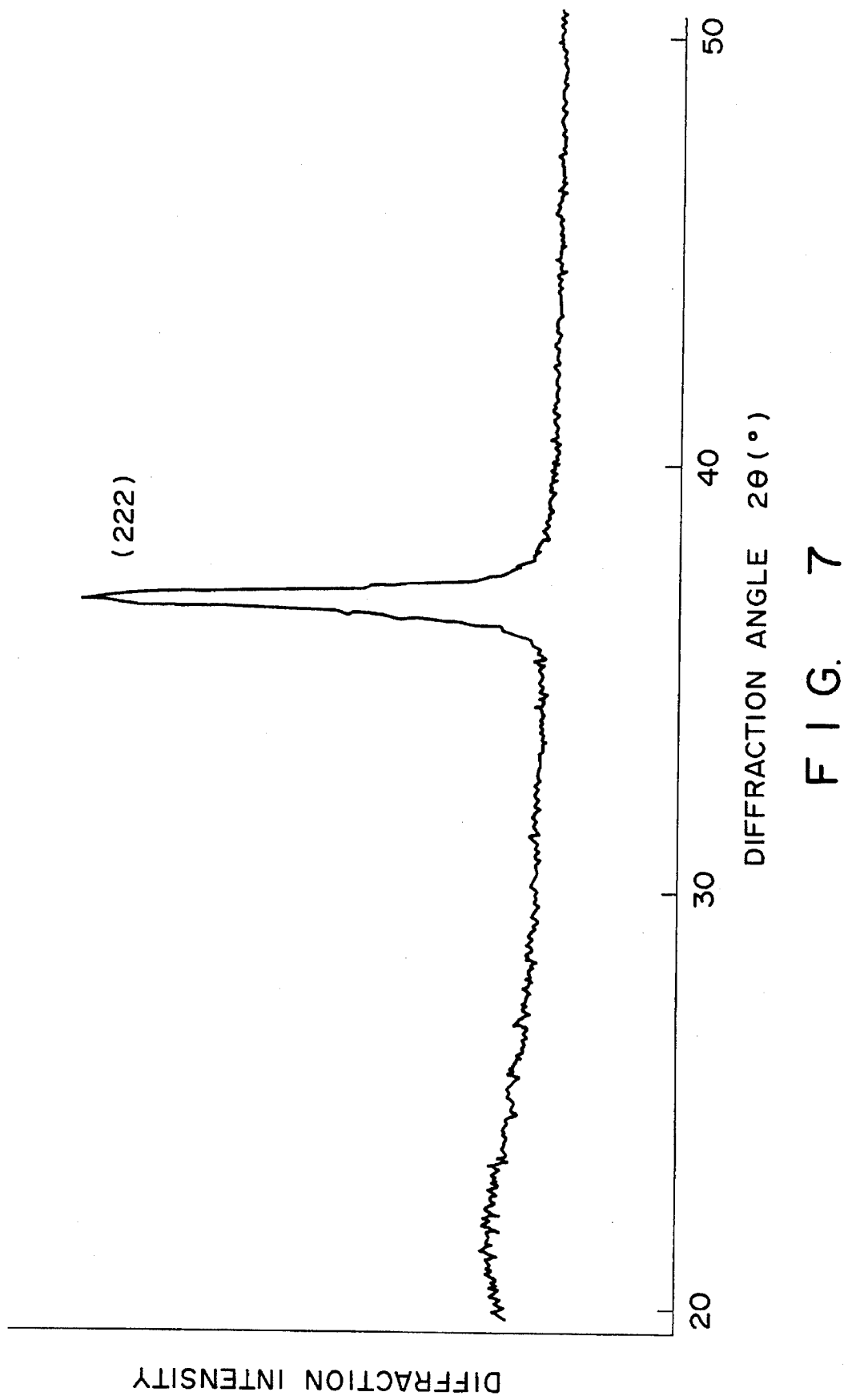

An $NiFe_2O_4$ film was formed on the $Co_{1.5}Fe_{1.5}O_4$ <111> oriented film manufactured in Example 2, using the ion beam sputtering apparatus shown in FIG. 1, and without ion radiation being performed. FIG. 7 shows the X-ray diffraction pattern of this $NiFe_2O_4$ film. As is apparent from FIG. 7, a <111> direction of the NiFe2O4 film is oriented perpendicularly to the film surface. That is, the $NiFe_2O_4$ film in which the <111> direction was oriented was formed without the use of Ar ions. This is confirmed that epitaxial growth occurred due to an effect of the underlying $Co_{1.5}Fe_{1.5}O_4$ <111> oriented film. This means that a crystal oriented spinel ferrite film formed on an amorphous substrate by the method of the present invention can be used as a substrate for growing another crystal oriented film.

Example-5

Thin films consisting of various oxides having the compositions other them spinel ferrite shown in Table 2 were formed following the same procedures as in Example 1. As a result, any of the formed films was an oriented film in which a specific crystal direction was oriented perpendicular to the film surface. Orientation directions of these films, are also shown in Table 2.

TABLE 2

| Sample No. | Composition | Orientation |
| --- | --- | --- |
| 2-1 | $Y_2BiFe_5O_{12}$ | <110> |
| 2-2 | $La_{0.7}Sr_{0.3}MNO_3$ | <110> |
| 2-3 | $BaTiO_3$ | <111> |
| 2-4 | $ZnO$ | <001> |
| 2-5 | $MgO$ | <100> |
| 2-6 | $BaFe_{12}O_{19}$ | <001> |

Example-6

A $Co_{1.5}Fe_{1.5}O_4$ film was formed on a quartz glass substrate, following the same procedures as in Example 1, except that the substrate was heated to 500° C. by the heater shown in FIG. 1. As in the case of the film formed without heating the substrate, that formed in this example had a <111> orientation perpendicular to the film surface, and the full-width at half maximum of a rocking curve was as small as 3°, i.e., the orientation was further improved.

Figure 8:
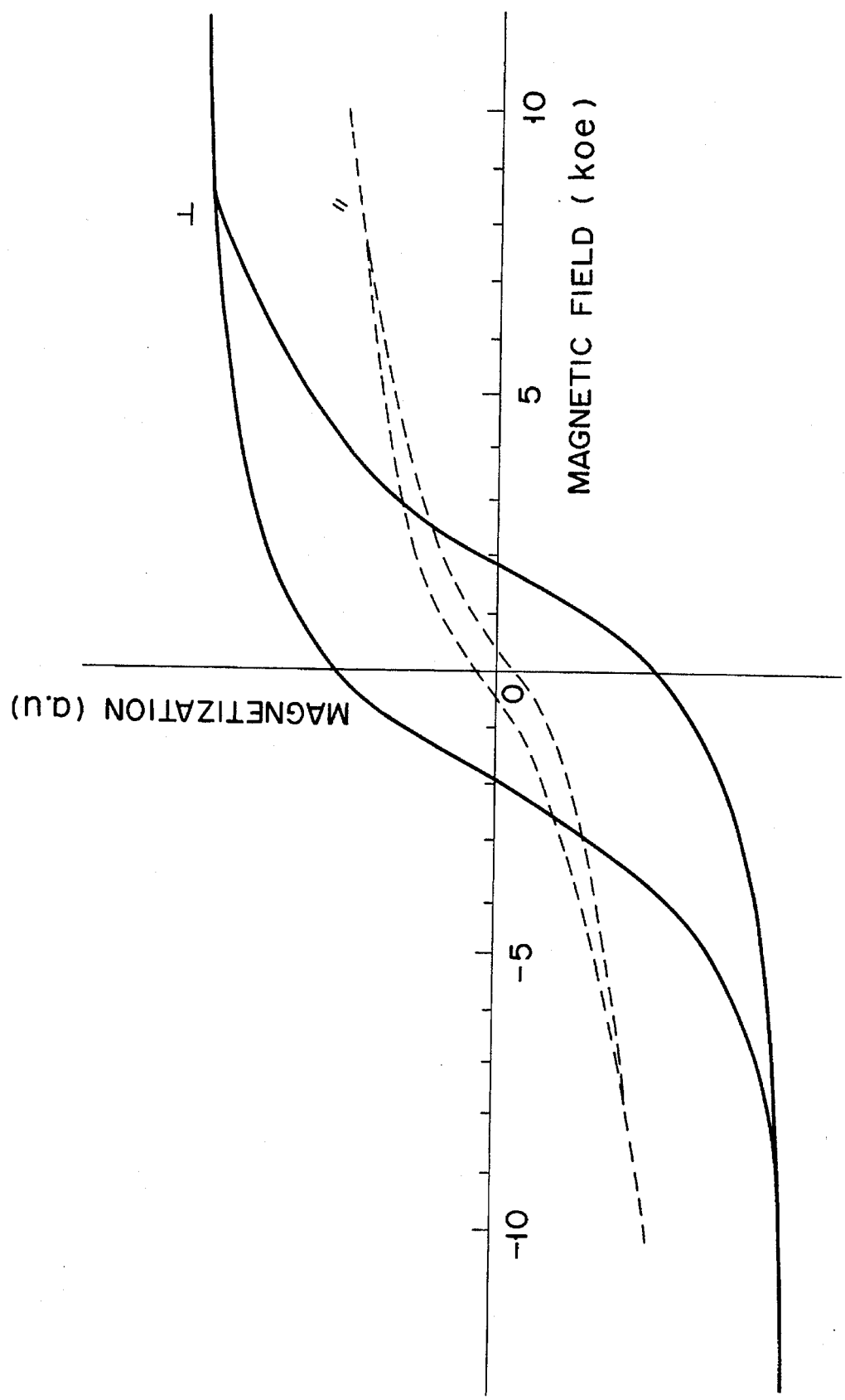

A magnetic field was applied in directions parallel and perpendicular to the oriented film, and hysteresis curves were measured. The result of measurement is shown in FIG. 8. As is apparent from a comparison of FIGS. 6 and 8, the oriented film formed by heating the substrate has a stronger perpendicular magnetic anisotropy than that obtained without heating the substrate.

Example-7

A $CoFe_2O_4$ film was formed on a polyimide resin substrate, following the same procedures as in Example 1, except that the acceleration voltage of the subgun was set to 100 V. As in the case of the film formed on a quartz substrate, the film formed was <110> axis-oriented.

Example-8

Figure 9A:
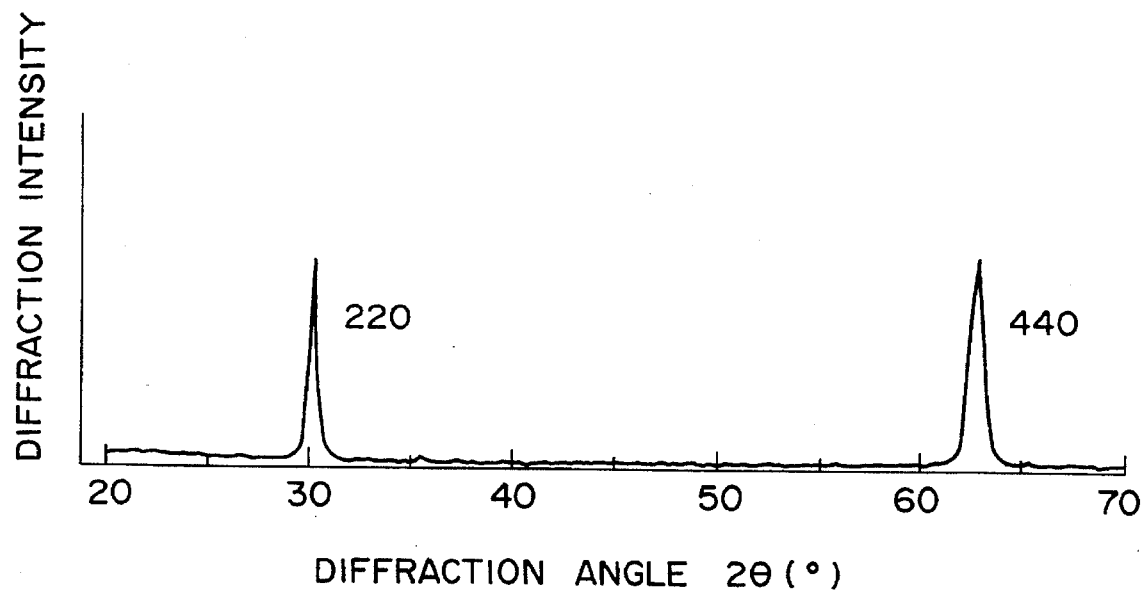
Figure 9B:
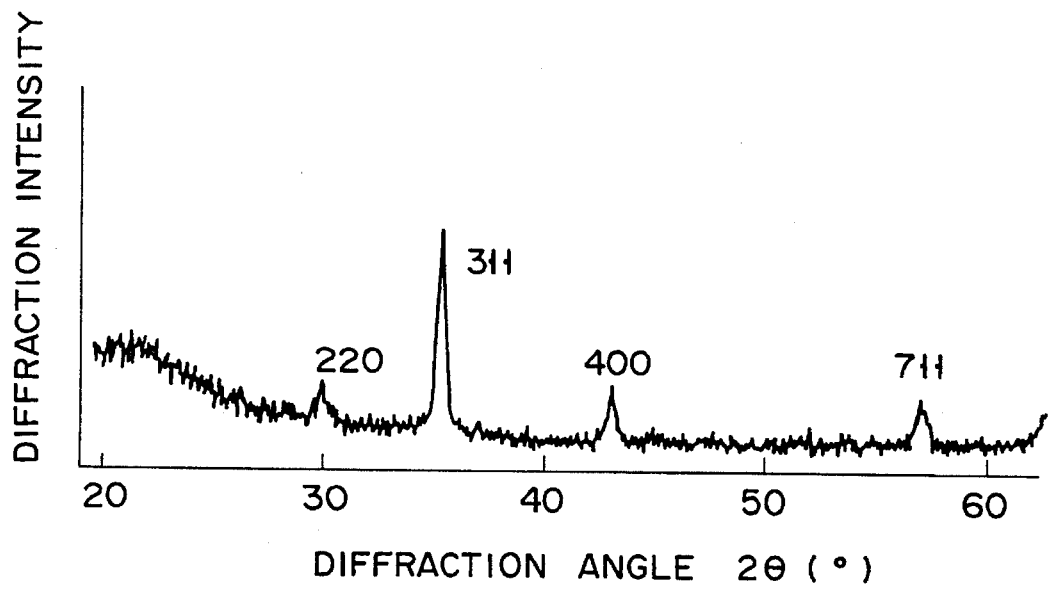

A $CoFe_2O_4$ film was formed on a quartz glass substrate, following the same procedures as in Example 1, and subjected to heat treatment in air at 800° C. for 30 minutes. FIG. 9A shows the X-ray diffraction pattern of the $CoFe_2O_4$ manufactured film, while FIG. 9B shows the X-ray diffraction pattern of a $CoFe_2O_4$ film manufactured, for the sake of comparison, by performing film formation without ion radiation by the subgun and then heating this film. As shown in FIG. 9A, in the case of the $CoFe_2O_4$ film formed by the manufacturing method described above, only (220) and (440) diffraction peaks appear, i.e., the <110> orientation is perpendicular to the film surface, whereas, as can be seen in FIG. 9B, the film formed without performing ion radiation by the subgun shows the presence of diffraction rays from various planes, i.e., the film is not preferredly oriented. This means that a Co ferrite film in which a specific direction of a crystal is preferredly oriented can be formed on an amorphous substrate by radiating an ion beam onto the film during film formation.

Example-9

A $Co_{1.8}Fe_{1.2}O_y$ film was formed on a quartz glass substrate, following the same procedures as in Example 1. The crystal structure of the film in the as-deposited state and that of a film subjected to heat treatment at 900° C. for 30 minutes were determined on the basis of their respective X-ray diffraction patterns. FIG. 10A shows the X-ray diffraction pattern of the as-deposited film, and FIG. 10B shows that of the film heated to 900° C. As shown in FIG. 10A, a <111> direction is already oriented perpendicular to the film surface in the as-deposited state. In this X-ray diffraction pattern, however, reflection by a (111) plane— which can be observed in a spinel crystal structure—was not found; only reflection by a (222) plane and that by a (444) plane were observed within a 2θ range of 15° to 80°. From this, it was determined that the film formed in this example had a crystal structure slightly different from the spinel structure.

Example-10

Spinel ferrite films having the compositions shown in Table 3 were formed on quartz glass substrates, following the same procedures as in Example 8. As in the case of the film obtained in Example 8, any of the films formed was an oriented film in which a specific crystal direction was oriented perpendicular to the film surface. Orientation directions of these films are also shown in Table 3.

TABLE 3

| Sample No. | Composition | Orientation |
|---|---|---|
| 3-1 | $Co_{0.8}Fe_{2.2}O_4$ | <110> |
| 3-2 | $CoFe_2O_4$ | <110> |
| 3-3 | $Co_{1.5}Fe_{1.5}O_4$ | <111> |
| 3-4 | $Co_{1.8}Fe_{1.2}O_4$ | <111> |
| 3-5 | $Co_{0.8}Cr_{1.2}FeO_4$ | <110> |
| 3-6 | $NiFe_2O_4$ | <111> |
| 3-7 | $Cu_{0.17}Fe_{2.83}O_4$ | <110> |
| 3-8 | $ZnFe_2O_4$ | <110> |

Note that for comparison, films having the same compositions were formed without ion radiation being performed, were then subjected to heat treatment, and their orientations checked. As a result of checking, it was found that none of the films formed was oriented.

Example-11

Figure 11:
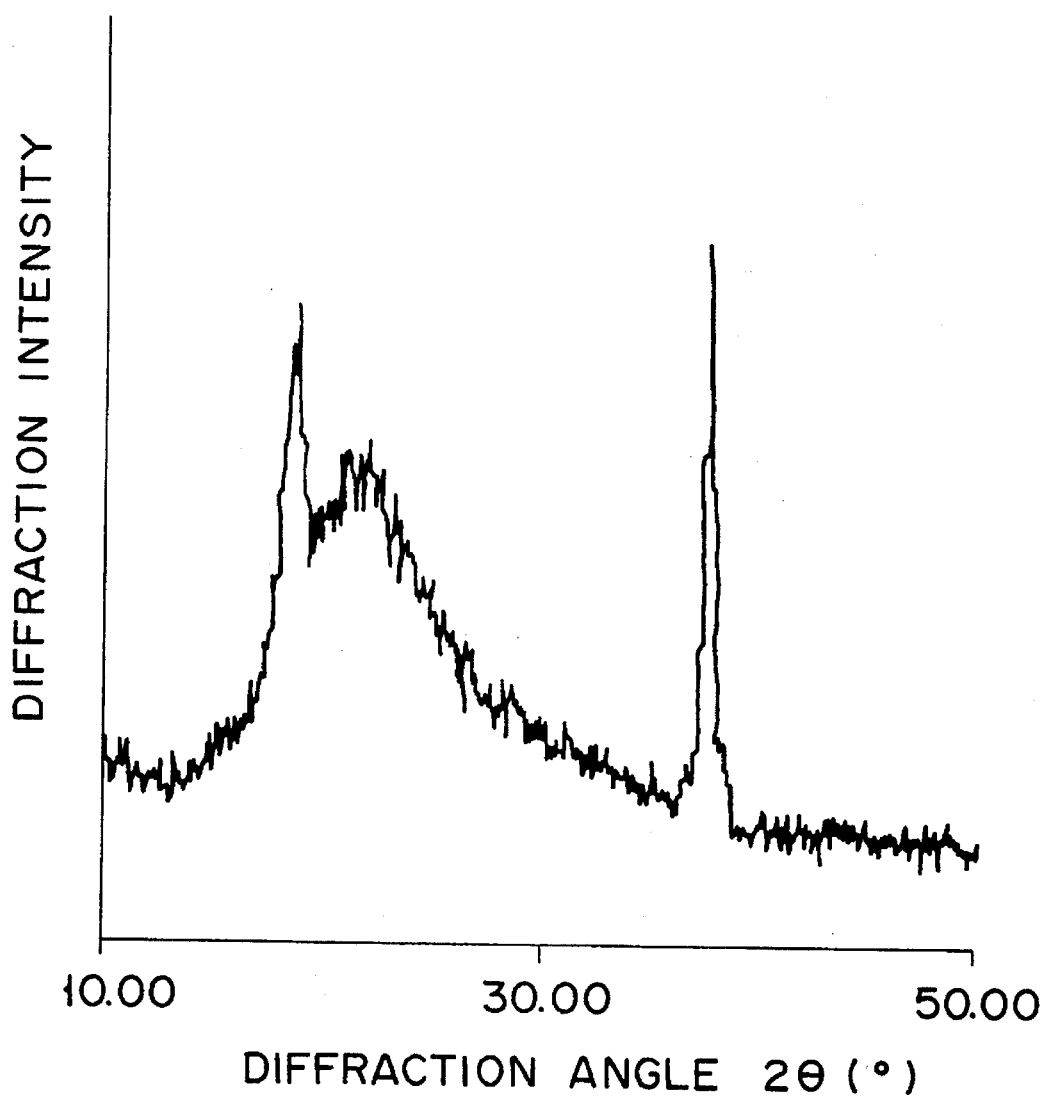

A $Co_{1.5}Fe_{1.5}O_4$ film was formed on a quartz glass substrate, following the same procedures as in Example 8, except that film formation was performed while the substrate was being heated to 500° C. by the heater shown in FIG. 1 and the heat treatment temperature after film formation was set to 500° C. FIG. 11 shows an X-ray diffraction pattern of this film, and as is apparent from this figure, the film exhibited a sharp diffraction peak in spite of the low heat treatment temperature of 500° C., i.e., good crystallinity was confirmed. However, in a film obtained without heating the substrate, the peak intensity was low and the peak width was large, even if the film was heat treated in 500° C. From this, it was determined that heating of the substrate upon film formation contributed to improved crystallinity.

Example-12

A $CoFe_2O_4$ film was formed on the $Co_{1.5}Fe_{1.5}O_4$ <111> oriented film formed in Example 10. In this example, formation of the $CoFe_2O_4$ film was carried out by use of the ion beam sputtering apparatus shown in FIG. 1, and without Ar ion radiation by the subgun. When the X-ray diffraction pattern of the film formed was measured, only reflection by a (111) plane was observed; i.e. no reflection by any other plane reflection was found. In other words, the $CoFe_2O_4$ film of this example was <111> oriented, for the reason that $CoFe_2O_4$ was epitaxially grown by virtue of the effect exerted by the underlying $Co_{1.5}Fe_{1.5}O_4$ <111> oriented film. From this, it was confirmed that the spinel ferrite film with preferred crystal orientation formed on an amorphous substrate by the method of the present invention can be used as a substrate for growing another crystal-oriented film.

Example-13

A $CO_{1.8}Fe_{1.2}O_y$ film was formed on a quartz glass substrate, following the same procedures as in Example 1. The as-deposited film obtained and films subjected to heat treatment at 400° C., 500° C., 600° C., 700° C., 800° C., and 900° C. for 30 minutes were prepared. Following the same procedures as in Example 9, the crystal structure of the as-deposited film and that of the film subjected to the heat treatment at 900° C. were determined from their respective X-ray diffraction patterns. As a result, the same results as those shown in FIGS. 10A and 10B were obtained. That is, it was found that the as-deposited film was a <111> oriented film; however, reflection by a (111) plane, which is assumed to be more intense than that of a (222) plane in a spinel structure, was not observed. According to an ASTM card, $I_{111}/I_{222}$ of a $CoFe_2O_4$ composition is 1.25. This indicates that the structure of the film formed in this example differs from the spinel structure. When this film was subjected to heat treatment at 900° C., reflection by the (111) plane appeared as shown in FIG. 10B; i.e., it was confirmed that the film restored the spinel structure. In other words, the as-deposited film was in a metastable state.

The structure of a metastable phase has not yet been clarified. If, however, reflection by especially the (111) plane does not appear at all as in the above film, it is assumed that the film has a structure having a unit cell size ⅛ that of the spinel structure, i.e., a structure having a lattice constant half that of the spinel structure.

Figure 12:
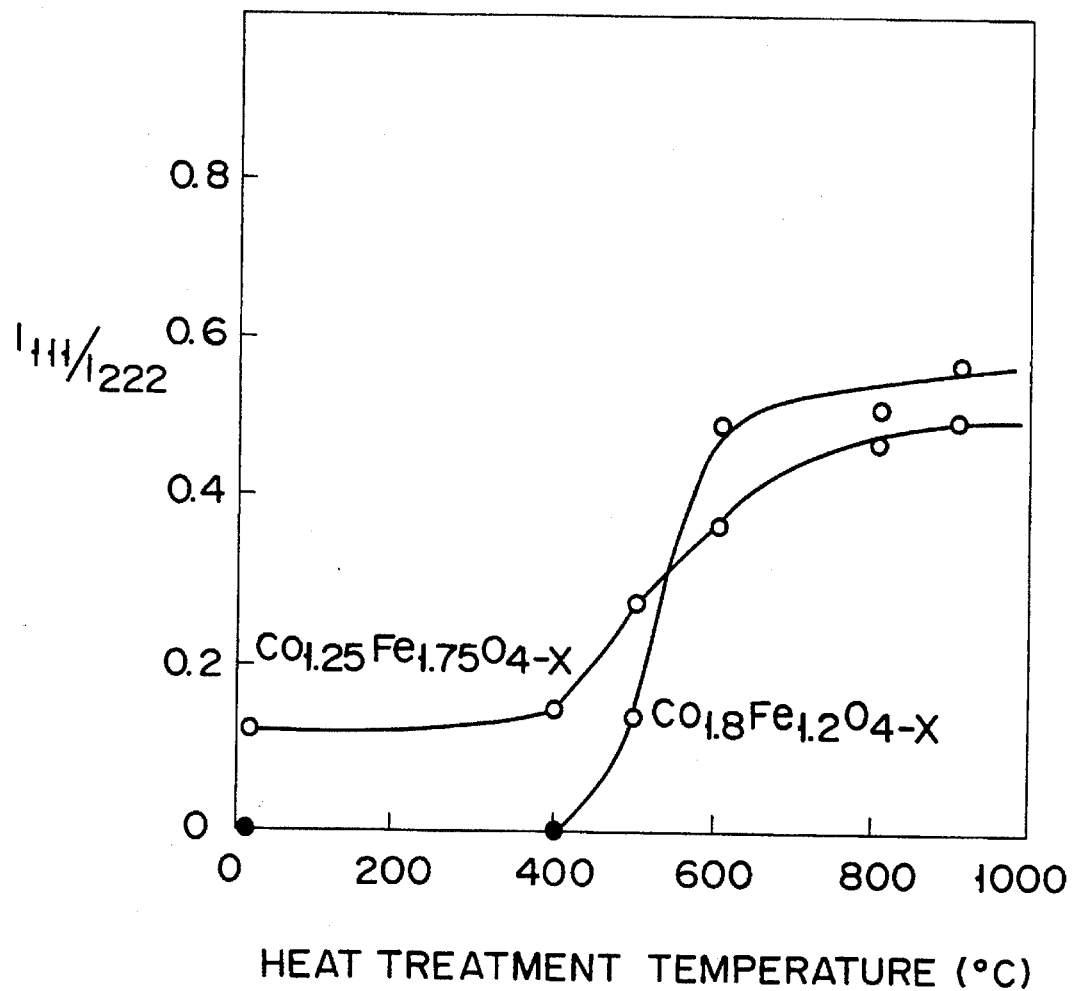
FIG. 12 is a graph showing the heat treatment temperature dependency of the X-ray diffraction peak intensity ratio of an oxide thin film according to the present invention.

Stability of the metastable phase was checked for the as-deposited film having a $Co_{1.8}Fe_{1.2}O_x$ composition and the films subjected to the heat treatment at the above temperatures from a change in diffraction peak intensity of an X-ray diffraction pattern. The same test was performed on a $Co_{1.25}Fe_{1.75}O_y$ film. FIG. 12 shows the temperature dependency of a ratio $I_{111}/I_{222}$ of reflection peak intensity of the (111) plane with respect to that of the (222) plane of each film when the X-ray diffraction peak is represented by an index assuming that the film has the spinel structure. Almost no difference was found in the peak intensity ratio of the film subjected to the heat treatment at 400° C. and that of the as-deposited film, and the metastable phase was stable. When the heat-treatment temperature was increased to 500° C. or more, however, the intensity ratio of diffraction peaks changed significantly, and it was confirmed that a spinel structure was formed.

Example-14

A $Co_{1.25}Fe_{1.75}O_y$ film was deposited on a quartz glass substrate, following the same procedures as in Example 1, and the wavelength dependency of the magneto-optical Faraday rotation angle of the thin film was checked. For the purpose of comparison, the Faraday rotation angle of a thin film having a spinel structure manufactured by normal sputtering and without ion radiation by the subgun was also checked.

The results of these checks are shown in FIG. 13. Referring to this figure, it can be seen that a positive peak falling within the range of 600 to 700 nm is caused by crystal field transition of $Co^{2+}$ ions in a tetrahedral site, and that a negative peak at 800 nm is caused by charge transfer between $Co^{2+}$ ions and $Fe^{3+}$ ions in an octahedral site. Specifically, it is sugested that while metal ions assume specific tetrahedral and octahedral sites of the spinel in the film having the spinel structure formed without the performing of ion radiation, the number of metal ions occupying the tetrahedral site is small in the film formed by ion radiation. It is assumed that this film has a structure which has a lattice constant half that of the spinel structure and in which metal ions occupying the tetrahedral site displace to the octahedral site. A possible example of this crystal structure is an NaCl structure.

Example-15

A $Co_{0.8}Fe_{2.2}O_4$ film was formed on the $Co_{1.8}Fe_{1.2}O_y$ <111> oriented film formed in Example 13, using the ion beam sputtering apparatus shown in FIG. 1 and without the performing of ion radiation. FIG. 14 shows X-ray diffraction pattern of the formed $Co_{0.8}Fe_{2.2}O_4$ film, and as is apparent from this figure, this is a <111> oriented film having the spinel structure. This confirms that a $Co_{0.8}Fe_{2.2}O_4$ film having a <111> orientation can be formed without an assistance of Ar ions. It was assumed that this is because the epitaxial growth occurring by virtue of the effect exerted by the underlying $Co_{1.8}Fe_{1.2}O_y$ <111> oriented film. This means that a spinel ferrite film with preferred crystal orientation formed on an amorphous substrate by the method of the present invention can be used as a substrate for growing another crystal-oriented film.

Example-16

A $Co_{1.5}Fe_{1.5}O_4$ thin film was formed on a quartz glass substrate, following the same procedures as in Example 1.

Figure 15:
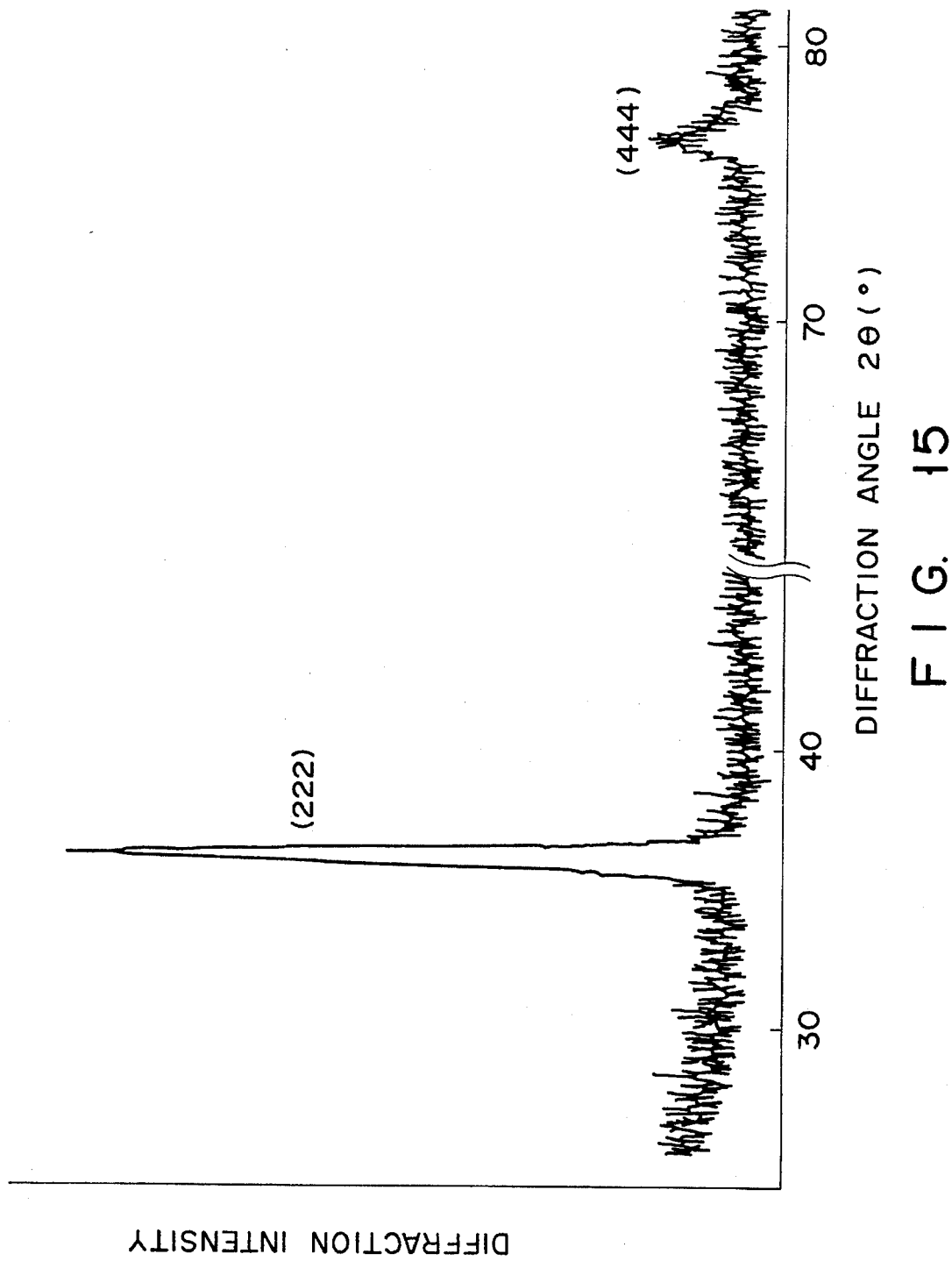

FIG. 15 shows the X-ray diffraction pattern of the $Co_{1.5}Fe_{1.5}O_4$ film formed by the above method, and as is apparent from this figure, only (222) and (444) diffraction peaks are to be found; i.e., the <111> orientation is perpendicular to the film surface.

This means that a Co ferrite film the <111> direction of a crystal is preferredly oriented can be formed on an amorphous substrate by ion beam radiation being performed during film formation.

Figure 16A:
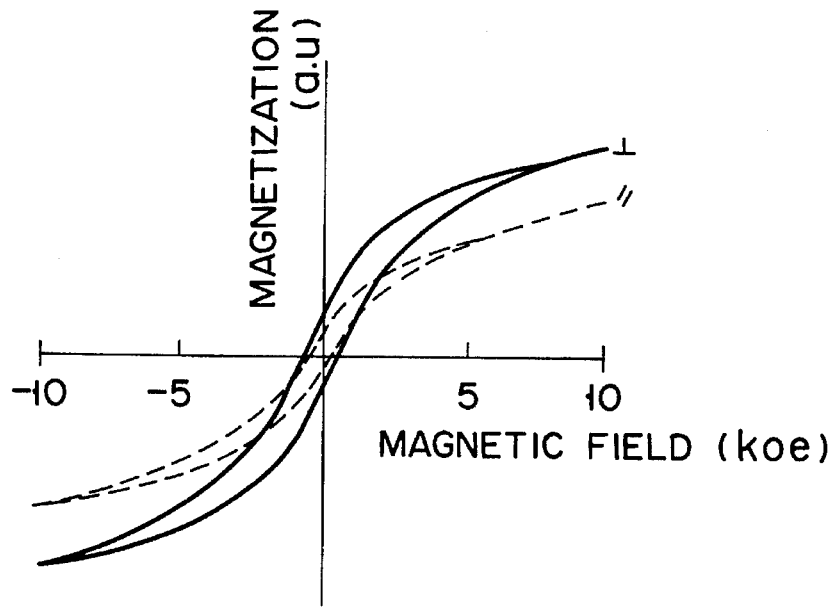
Figure 16B:
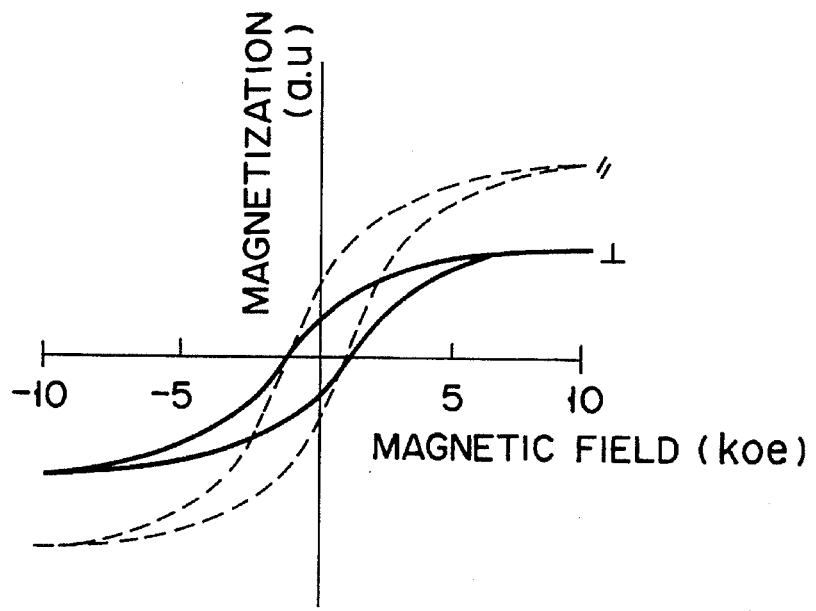

FIG. 16A shows hysteresis curves obtained when a magnetic field is applied in directions parallel and perpendicular to the film. As apparent from FIG. 16A, a higher residual magnetic flux density and a higher coercive force are obtained when the magnetic field is applied perpendicular to the film surface, i.e., the film has perpendicular magnetic anisotropy. FIG. 16B shows hysteresis curves of a film (non-oriented film) formed following the same procedures as in this example, except that no ion radiation was performed. The result shown in FIG. 16B is opposite to that shown in FIG. 16A, i.e., the film has in-plane magnetic anisotropy.

The Faraday rotation angle of the <111> oriented film of this embodiment was found to be as large as $3 \times 10^4$ degrees/cm at a point of a wavelength of 500 nm.

From this, it was confirmed that this $Co_{1.5}Fe_{1.5}O_4$ <111> oriented film is suitable as a recording layer of a magneto-optical recording medium.

Example-17

Following the same procedures as in Example 1, films were formed on glass substrates by using the compositions shown in Table 4 as targets. As a result, each of the films formed was a <111> oriented film in which a <111> direction was oriented perpendicular to the substrate. In addition, each film was found, as a result of magnetization measurement, to have perpendicular magnetic anisotropy. When the Faraday rotation angle of each film was measured, the values shown in Table 4 were obtained. As is apparent from Table 4, a substitution effect of a T element (at least one of Cr, Al, Mn, and Rh) was significant.

TABLE 4

| Composition | Faraday Rotation Angle (630 nm) °/cm |
|---|---|
| $Co_{1.2}Fe_{1.8}O_4$ | $1 \times 10^4$ |
| $CoCrFeO_4$ | $3 \times 10^4$ |
| $CoRhFeO_4$ | $5 \times 10^4$ |
| $CoAlFeO_4$ | $3 \times 10^4$ |
| $Co_{1.5}Mn_{0.5}FeO_4$ | $2 \times 10^4$ |
| $Co_{1.5}Cr_{0.5}FeO_4$ | $6 \times 10^4$ |

Example-18

$CoFe_2O_4$ was used as a target to form a $CoFe_2O_4$ film on a glass substrate following the same procedures as in Example 1. When the orientation of the film formed was checked by X-rays, it was found to be a <110> oriented film. In addition, it was confirmed by magnetization measurement that the film had in-plane magnetic anisotropy.

Further, a <111> oriented film was formed by using $Co_{1.8}Fe_{1.2}O_4$ as a target.

A $CoFe_2O_4$ film was formed on the above <111> oriented film, without an ion assistance, and X-ray measurement was performed. As a result, it was found that the film formed was a <111> oriented film. In other words, the $CoFe_2O_4$ <111> oriented film was epitaxially grown on the <111> oriented $Co_{1.8}Fe_{1.2}O_4$ film, had perpendicular magnetic anisotropy, and had the same characteristics as those of the film obtained in Example 1. Thus, it was confirmed that the $CoFe_2O_4$ film formed as described above is suitable as a recording layer of a magneto-optical recording medium.

Example-19

A 2,000-Å thick $Co_{1.25}Fe_{1.75}O_4$ thin film was formed on a quartz glass substrate, following the same procedures as in Example 1. The X-ray diffraction pattern of this film was found to be substantially the same as that shown in FIG. 15, i.e., it was confirmed that a <111> direction was oriented perpendicularly to the film surface.

FIG. 17 shows magnetization curves obtained when a magnetic field was applied in parallel and perpendicular direction to the above film. As is apparent from FIG. 17, a higher coercive force was obtained when the magnetic field was applied perpendicularly to the film surface. In other words, it was confirmed that the film has perpendicular magnetic anisotropy.

An Al target (diameter=3 inches, purity=99.9%) was used to form an Al film having a thickness of about 2,000 Å on the $Co_{1.25}Fe_{1.75}O_4$ film using the apparatus shown in FIG. 1. Upon film formation, ion radiation by the subgun (second ion gun 14) was not performed. The formed film was subjected to a heat treatment in air at 400° C. for one hour and then cooled by air. FIG. 18 shows magnetization curves obtained when a magnetic field was applied in parallel and perpendicular directions to the film after the heat treatment. As is apparent from FIG. 18, the film had perpendicular magnetic anisotropy with rectangularity higher than that of the film shown in FIG. 17. This is because a compression stress caused by a difference of a thermal expansion coefficient with respect to Al was applied to the $Co_{1.25}Fe_{1.75}O_4$ film. The same test was conducted on other metal films, formed of Au and the like. As a result, it was confirmed that the rectangularity was greatly improved by forming the metal film.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An oxide film with a preferred crystal orientation, said oxide film is formed directly on an amorphous substrate and has a spinel crystal structure, wherein <110> direction of the oxide film is the preferred crystal orientation.

2. A film according to claim 1, wherein said oxide film is Co ferrite, Ni ferrite, Mn ferrite, Zn ferrite, or magnetite.

3. An oxide film with a preferred crystal orientation, said oxide film being formed directly on an amorphous substrate and having a spinel crystal structure, and having a composition represented by a formula $A_xB_{3-x}O_y$, wherein A represents at least one member selected from the group consisting of Mn, Co, Ni, Cu, Mg, Cr, Zn, Li, Ti, B represents Fe or Al, $0.5 \leq x \leq 2.0$, and $2.5 \leq y \leq 4$, wherein a <110> direction of the oxide film is the preferred orientation, and in which the ratio $I_{111}$ represents intensity of the reflections of (111) crystal planes and $I_{222}$ represents intensity of reflections of (222) crystal planes, is less than 0.2 for X-ray diffraction peaks of said oxide film indexed as a spinel structure.

4. A magneto-optical recording medium, comprising:

a substrate having an amorphous surface; and a magnetic-optic recording layer formed directly in said amorphous surface and containing a spinel ferrite film, the spinel ferrite film has a preferred orientation that is perpendicular to said amorphous surface of said substrate, and said preferred orientation is along the <110> direction, wherein said spinel ferrite has a composition represented by a formula $Co_xFe_{3-x-y}T_yO_{4-\delta}$ for $0.5 \leq x \leq 1.8$, $0 < y \leq 1.5$, $0 < \delta < 1$, and $0.8 \leq 3-x-y \leq 2.5$, wherein T represents at least one member selected from the group consisting of Cr, Al, Mn, and Rh.

5. An oxide film with a preferred crystal orientation, said oxide film is formed directly on an amorphous substrate and has a spinel crystal structure, wherein a <110> direction of said oxide film is the preferred orientation, said oxide film being manufactured by a method comprising the steps of:

depositing the oxide film on a substrate; and radiating ions onto the oxide film during said depositing step.

6. A film according to claim 5, wherein the acceleration voltage of ions to be radiated onto said deposited film falls within a range of 20 V to 2 kV.

7. A film according to claim 6, wherein the acceleration voltage of ions to be radiated onto said deposited film falls within a range of 20 V to 500 V.

8. A film according to claim 3, manufactured by a method comprising the steps of:

depositing an oxide film on a substrate; and radiating ions onto the film during said deposition step.

9. A film according to claim 8, wherein the acceleration voltage of ions to be radiated onto said deposited film falls within a range of 20 V to 2 kV.

10. A film according to claim 9, wherein the acceleration voltage of ions to be radiated onto said deposited film falls within a range of 20 V to 500 V.

\* \* \* \* \*